(12) United States Patent
Furutani

(10) Patent No.: US 11,229,149 B2
(45) Date of Patent: Jan. 18, 2022

(54) ELECTRONIC COUPLER REMOVAL TOOL

(71) Applicant: Honda Motor Co., Ltd., Tokyo (JP)

(72) Inventor: Brian Patrick Furutani, Gardena, CA (US)

(73) Assignee: Honda Motor Co., Ltd., Tokyo (JP)

( * ) Notice: Subject to any disclaimer, the term of this patent is extended or adjusted under 35 U.S.C. 154(b) by 231 days.

(21) Appl. No.: 16/355,610

(22) Filed: Mar. 15, 2019

(65) Prior Publication Data

US 2020/0296870 A1    Sep. 17, 2020

(51) Int. Cl.
H05K 13/04    (2006.01)

(52) U.S. Cl.
CPC ................ H05K 13/0491 (2013.01)

(58) Field of Classification Search
CPC . H01R 12/7023; H01R 43/28; H05K 13/0491
See application file for complete search history.

(56) References Cited

U.S. PATENT DOCUMENTS

| | | | |
|---|---|---|---|
| 3,210,836 A * | 10/1965 | Johanson | H05K 13/0491 29/278 |
| 3,852,864 A | 12/1974 | Kirk, Jr. | |
| 4,052,788 A * | 10/1977 | Hastings | B25B 27/14 29/764 |
| 6,363,560 B1 | 4/2002 | Kesinger | |
| 6,679,888 B2 * | 1/2004 | Green | A61B 17/8866 606/86 R |
| 6,733,323 B2 | 5/2004 | Tso-Chin | |
| 7,080,581 B2 | 2/2006 | Reese | |
| 7,021,966 B2 | 4/2006 | Ikeda | |
| 7,181,999 B1 | 2/2007 | Skeels | |
| 7,788,788 B2 | 9/2010 | Sullivan | |
| 2003/0051337 A1 * | 3/2003 | Holliday | B25B 27/10 29/751 |
| 2020/0296870 A1 * | 9/2020 | Furutani | H01R 43/28 |

FOREIGN PATENT DOCUMENTS

| | | |
|---|---|---|
| CN | 1449077 A | 10/2003 |
| CN | 104348069 B | 9/2016 |
| CN | 104767099 B | 9/2017 |
| JP | 4301449 B2 | 7/2009 |

* cited by examiner

*Primary Examiner* — Minh N Trinh
(74) *Attorney, Agent, or Firm* — American Honda Motor Co., Inc.; Andrew Kefalonitis, Jr.

(57) ABSTRACT

An electronic coupler removal tool (100) that includes a housing (102), a wall (104), a hook member (106), an electronic coupler-receiving portion (108), and an electronic coupler-release mechanism (202), is provided. The housing includes a first surface (102a), a second surface (102b) and a third surface (102c). The wall extends substantially perpendicularly from the first surface. The hook member extends substantially perpendicularly from the wall and is configured to receive a cable portion (308) coupled to an electronic coupler (300). The hook member, the wall, and the first surface define the electronic coupler-receiving portion that is configured to slidably receive the electronic coupler. The electronic coupler release mechanism includes a plunger rod (204) having a first end (210) and a second end (212) and is movable with respect to the housing (102) to engage a locking tab (306) of the electronic coupler at least partially within the electronic coupler-receiving portion.

17 Claims, 5 Drawing Sheets

ELECTRONIC COUPLER REMOVAL TOOL

BACKGROUND

Electronic couplers are used to connect networking cables that transmit and/or receive electronic signals to different communication ports of a vehicle's network. These electronic couplers are used within the vehicle's wired networks to connect various circuit board ports provided in several vehicle electronic systems, such as global navigation satellite systems (GNSS), rear entertainment systems (RES), air bag systems, infotainment systems, and assorted multimedia devices. Typically, a locking tab may be provided to secure individual electronic couplers within individual circuit board ports when individual electronic couplers are inserted into the corresponding circuit board ports. The electronic couplers may be held in place using the locking tab which may be retained in a groove provided in a corresponding circuit board port.

In order to unplug or remove the electronic coupler from a circuit board port, the locking tab may have to be carefully released from the locked state. This may require a pressing of the locking tab in a specific direction. As the form factor of the locking tab is small, a push force on the locking tab may sometimes be applied in an undesired direction or may remain inadequate for a finger-assisted release of the locking tab. This may prevent a full disengagement of the locking tab from the circuit board port. In some cases, an operator may have to handle the electronic coupler carefully once the locking tab is released to prevent damage to the wire attached to the electronic coupler.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

In one aspect, an electronic coupler removal tool is provided herein. The electronic coupler removal tool may include a housing, a wall, a hook member, an electronic coupler-receiving portion, and an electronic coupler release mechanism. The housing may include a first surface, a second surface and a third surface. The wall may extend substantially perpendicular from a portion of the first surface. The hook member may extend substantially perpendicular from the wall and may be configured to receive a cable portion coupled to an electronic coupler. The electronic coupler-receiving portion may be defined by the hook member, the wall and the first surface of the housing and may be configured to slidably receive the electronic coupler. The electronic coupler release mechanism may include a plunger rod having a first end and a second end. The plunger rod may be movable in a first direction. The plunger rod may be configured to engage with a locking tab of the electronic coupler when positioned at least partially in the electronic coupler-receiving portion.

In another aspect, an electronic coupler removal tool is provided herein. The electronic coupler removal tool may include a base member, a housing, a wall, a hook member, an electronic coupler-receiving portion and an electronic coupler release mechanism. The housing may include a first surface, a second surface, and a third surface. The wall may extend substantially perpendicular from a portion of the first surface of the housing. The hook member may extend substantially perpendicularly from the wall and may be configured to receive a cable portion coupled to an electronic coupler. The electronic coupler-receiving portion may be defined partially by the hook member, the wall and the first surface of the housing and may be configured to slidably receive the electronic coupler. The electronic coupler release mechanism may include a plunger rod, a biasing member, and a flange. The plunger rod may include a first end and a second end and may be movable in a first direction. The plunger rod may be configured to engage with a locking tab when the electronic coupler is positioned in the electronic coupler-receiving portion. The biasing member may be circumferentially disposed about the plunger rod to extend the plunger rod from the first surface of the housing when under compression and may retract the plunger rod into the housing when the biasing member is released. The biasing member may be restrained within the housing by a stopper element. The flange may be configured at a second end of the plunger rod that is proximal to the third surface of the housing. An exertion force on the flange may compress the biasing member to cause the plunger rod to engage with a locking tab of the electronic coupler when the electronic coupler is positioned at least partially within the electronic coupler-receiving portion.

In yet another aspect, a method of removing an electronic coupler using an electronic coupler removal tool is provided herein. In the exemplary method, the electronic coupler removal tool is provided. The electronic coupler may include a hook member, an electronic coupler-receiving portion, and a plunger rod. Further, in the exemplary method, the hook member may be positioned partially around a cable portion coupled to the electronic coupler. The electronic coupler-receiving portion may be positioned around the electronic coupler. A force may be exerted on the plunger rod to disengage a locking tab of the electronic coupler from a corresponding circuit board port. Thereafter, the electronic coupler removal tool may be maneuvered to remove the disengaged electronic coupler from the corresponding circuit board port.

This summary is provided to introduce a selection of concepts in a simplified form that are further disclosed in the detailed description of the present disclosure. This summary is not intended to identify key or essential inventive concepts of the claimed subject matter, nor is it intended for determining the scope of the claimed subject matter.

Figure 1:
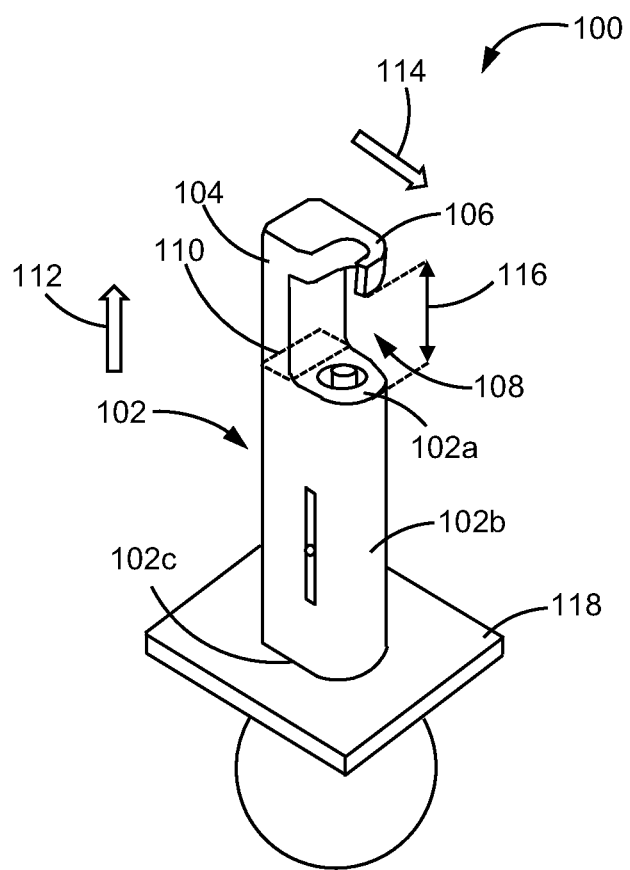
FIG. 1 illustrates a perspective view of an electronic coupler removal tool, in accordance with an embodiment of the disclosure.

The foregoing summary, as well as the following detailed description of the present disclosure, is better understood when read in conjunction with the appended drawings. For the purpose of illustrating the present disclosure, exemplary constructions of the preferred embodiment are shown in the drawings. However, the present disclosure is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION

The present disclosure relates to an electronic coupler removal tool for removal of an electronic coupler from a circuit board. The disclosed electronic coupler removal tool aims to prevent damage to a body of the electronic coupler, such as Rear Entertainment System (RES) connectors used in vehicles, during removal of the electronic coupler from a corresponding circuit board port. The disclosed electronic coupler removal tool further aims to prevent damage to a cable attached to the electronic coupler. For example, an operator who attempts to manually remove the electronic coupler by hand has to take care to completely disengage the locking tab which, due to the position of the locking tab and adjacent components, is challenging and leaves a risk of causing damage to the circuit board port, the electronic coupler, and/or the cable attached to the electronic coupler.

The disclosed electronic coupler removal tool includes an electronic coupler-release mechanism that may help an operator to securely disengage the locking tab of the electronic coupler. Also, the disclosed electronic coupler removal tool includes an electronic coupler-receiving portion defined by a hook member that supports the electronic coupler along with the cable during removal of the electronic coupler from the corresponding circuit board port. The electronic coupler removal tool may facilitate an operator to unplug and remove electronic couplers plugged into communication ports, without a need to apply undesirable force or maneuver on the electronic couplers and thereby, may prevent damage to the electronic couplers or cables coupled to the electronic couplers.

FIG. 1 is a perspective view of an exemplary embodiment of an electronic coupler removal tool 100. The electronic coupler removal tool 100 may include a housing 102, a wall 104, a hook member 106, and an electronic coupler-receiving portion 108. The housing 102 may include a first surface 102a, a second surface 102b, and a third surface 102c. The first surface 102a, the second surface 102b, and the third surface 102c may be joined with each other. The first surface 102a and second surface 102b may be substantially perpendicular to each other. Similarly, the second surface 102b and the third surface 102c may be substantially perpendicular to each other. The third surface 102c and the first surface 102a may be substantially parallel to each other and present at distal ends of the housing 102. The housing 102 may be a tube-shaped portion formed by an appropriate manufacturing process, such as additive manufacturing techniques.

The wall 104 may extend substantially perpendicularly from a portion 110 of the first surface 102a of the housing 102. Also, the wall 104 may extend perpendicularly in a first direction 112 and may be attached with the hook member 106. The hook member 106 may extend perpendicularly from the wall 104 in a second direction 114. The hook member 106 may be configured to receive a cable portion coupled to an electronic coupler.

Figure 3A:
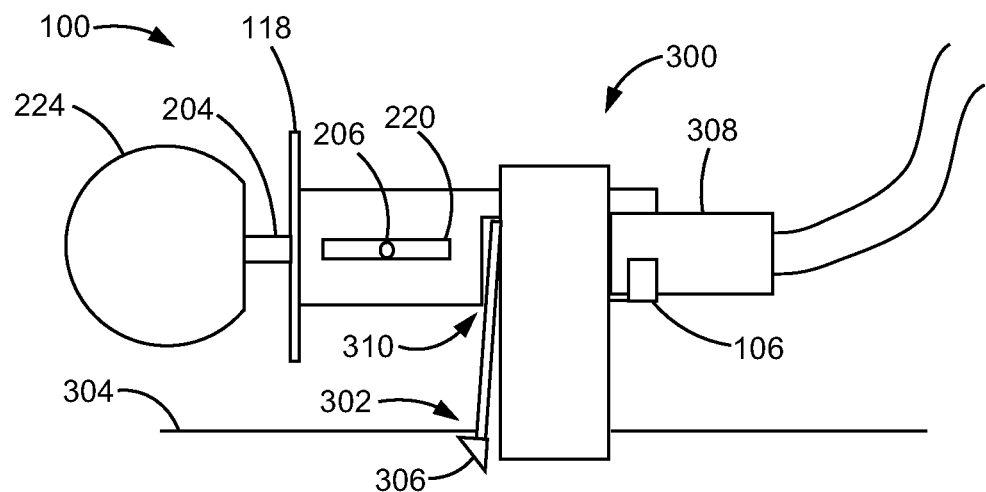
FIGS. 3a, 3b, and 3c, collectively, illustrate a sequence of operations performed using the electronic coupler removal tool of FIG. 1 for removal of an electronic coupler from a circuit board port, in accordance with an embodiment of the disclosure.
Figure 3B:
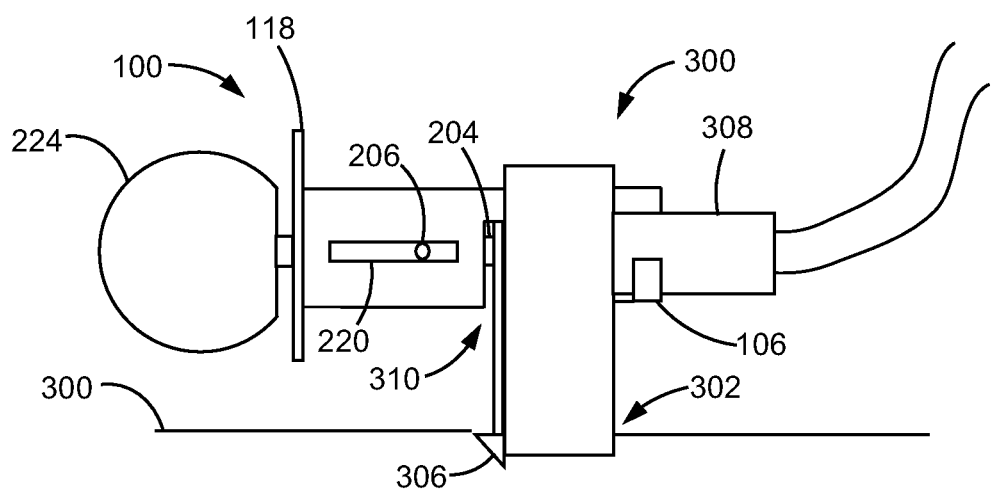
Figure 3C:
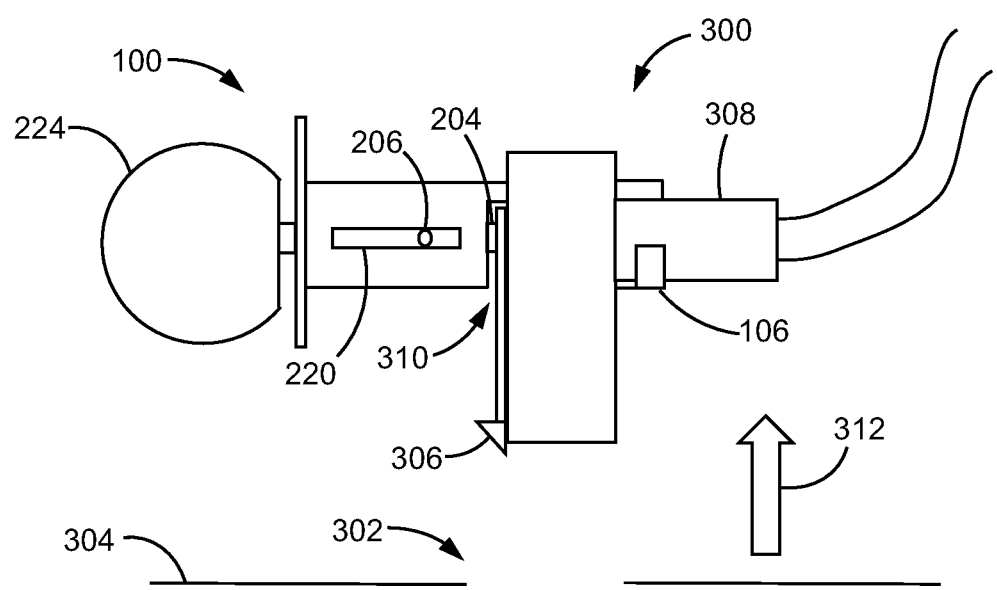

The first surface 102a of the housing 102, the wall 104, and the hook member 106 may at least partially define the electronic coupler-receiving portion 108. The electronic coupler-receiving portion 108 may be shaped to conform to an external profile of the electronic coupler and may be configured to slidably receive the electronic coupler. The electronic coupler-receiving portion 108 may have a C-channel shape defined by the first surface 102a and the hook member 106 to at least partially accommodate and securely hold onto the electronic coupler plugged into a communication port on a circuit board. An example of the communication port on the circuit board is shown in FIGS. 3a, 3b, and 3c. In some embodiments, the electronic coupler-receiving portion 108 may partially accommodate the electronic coupler 300 used in different in-vehicle communication systems. As an example, the different in-vehicle communication systems may be one of an in-vehicle entertainment system, an RES system, an in-vehicle infotainment system, or in-vehicle radio frequency (RF) communication system, or a navigation system.

The hook member 106 may be configured to engage with a cable portion (for example, a cable portion 308 shown in FIGS. 3a, 3b, and 3c) of the electronic coupler when the electronic coupler is positioned at least partially within the electronic coupler-receiving portion 108. In cases where the electronic coupler is held within the electronic coupler-receiving portion 108, the cable may be supported by the hook member 106. The hook member 106 may have suitable strength and shape to at least partially provide adequate support for removal of the electronic coupler. Also, the hook member 106 may be configured to at least partially encapsulate the cable portion without causing any damage to the cable portion and/or the electronic coupler.

In accordance with an embodiment, the hook member 106 and the first surface 102a may be carefully placed to leave an adequate clearance in order to accommodate multiple electronic couplers whose sizes may vary within a certain size range. In certain embodiments, the hook member 106 and the first surface 102a may be carefully positioned apart to provide an interference fit with an external profile of the electronic coupler. The hook member 106 and the first surface 102a may be separated by a distance 116. The distance 116 may determine a maximum size of the electronic coupler that may be accommodated within the electronic coupler-receiving portion 108. The hook member 106 may help to lift the electronic coupler once the electronic coupler removal tool 100 disengages (or presses) a locking tab, which is usually provided in the electronic coupler for a secure connection with a circuit board port. An example of the locking tab is shown in FIGS. 3a, 3b, and 3c. In accordance with an embodiment, the electronic coupler removal tool 100 may be a modular tool. In such a case, the hook member 106 may be configured to be detachably attached to the housing 102 of the electronic coupler removal tool 100.

In certain embodiments, the electronic coupler removal tool 100 may include a base member 118 coupled to the third surface 102c. The base member 118 may be at least one of coupled to and extending from the third surface 102c of the housing 102. The base member 118 may be substantially a rectangular shaped portion that may provide a support to user's fingers while the electronic coupler removal tool 100 is maneuvered to securely hold onto the electronic coupler mounted within a circuit board port. Further details of the electronic coupler removal tool are provided, for example, in FIGS. 2, 3a, 3b, and 3c.

Figure 2:
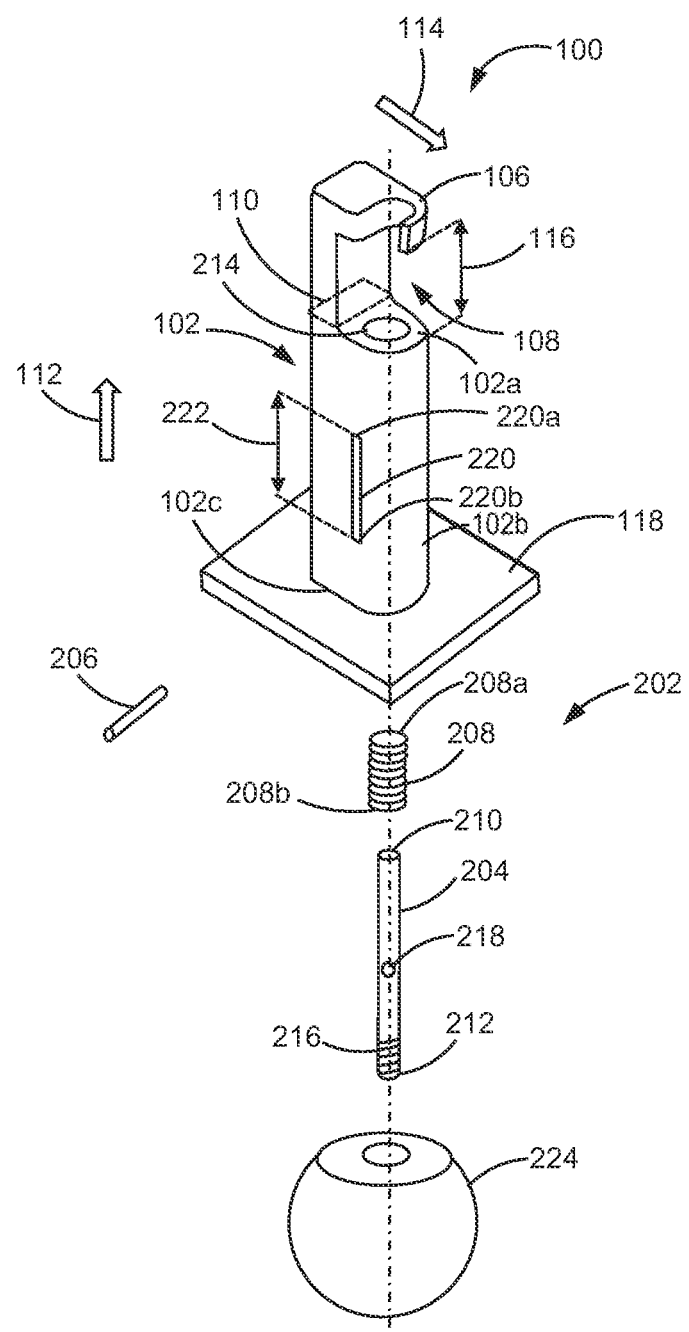
FIG. 2, illustrates an exploded view of the electronic coupler removal tool of FIG. 1, in accordance with an embodiment of the disclosure.

FIG. 2 is an exploded view of the electronic coupler removal tool 100 shown in FIG. 1. In the exemplary embodiment, the electronic coupler removal tool 100 includes an electronic coupler-release mechanism 202. The electronic coupler-release mechanism 202 may include a plunger rod 204, a stopper element 206, and a biasing member 208. The electronic coupler-release mechanism 202 may be utilized to release a locking tab of the electronic coupler by using the plunger rod 204 and to lift the electronic coupler as the plunger rod 204 maintains a force on the locking tab.

The plunger rod 204 may have a first end 210 and a second end 212 and may be movable in the first direction 112. The plunger rod 204 may be configured to engage with the locking tab of the electronic coupler when the electronic coupler is positioned at least partially within the electronic coupler-receiving portion 108. Moreover, a texture and/or soft material may be provided on the first end 210 of the plunger rod 204. The texture and/or soft material is configured to increase friction between the plunger rod 204 and the locking tab to increase the effectiveness of the electronic coupler removal tool 100. The soft material may include, but is not limited to, a cylindrical rubber bumper. The plunger rod 204 may be received in the housing 102 via a through hole 214 that extends between the first surface 102a and the third surface 102c. Also, the plunger rod 204 may have a threaded portion 216 at the second end 212. The plunger rod 204 may be made from a metallic material or a polymer material having a suitable strength to push force against the electronic coupler when the electronic coupler is received in the electronic coupler-receiving portion 108.

The plunger rod 204 may include at least the stopper element 206 and an opening 218 for receiving the stopper element 206. The stopper element 206 may be configured to engage with a slot 220 having a first end 220a and a second end 220b defined within the housing 102. The stopper element 206 may be configured to contact the second end 220b of the slot 220 when the first end 210 of the plunger rod 204 doesn't protrude beyond the first surface 102a of the housing 102. The slot 220 may be defined within the housing 102 and may be configured to limit movement of the stopper element 206, and therefore movement of the plunger rod 204 in the first direction 112. The slot 220 may be added during a production stage of the housing 102 or may be added later by removal of material from the housing 102. Also, the slot 220 may extend through the housing 102 and may remain substantially parallel to the second surface 102b. The first end 220a and the second end 220b of the slot 220 may be separated by a distance 222. The distance 222 may correspond to an allowable distance by which the plunger rod 204 may move in the first direction 112.

In accordance with an embodiment, the biasing member 208 may have a first end 208a and a second end 208b. The first end 208a of the biasing member 208 may engage with the housing 102 and the second end 208b of the biasing member 208 may engage with the stopper element 206. The biasing member 208 may be circumferentially disposed about the plunger rod 204. The biasing member 208 may be configured to bias the plunger rod 204 in a direction that is opposite to the first direction 112. This may be done so that the plunger rod 204 does not protrude into the electronic coupler-receiving portion 108 when the user positions the electronic coupler into the electronic coupler-receiving portion 108. The user may press against the force of the biasing member 208 to move the plunger 204 rod in the first direction 112. Further, the biasing member 208 may retract the plunger rod 204 into the housing 102 when the compression of the biasing member 208 is released. Under compression, the biasing member 208 may be restrained within the housing 102 by the stopper element 206. Initially, the biasing member 208 may be in a relaxed position where the first end 210 of the plunger rod 204 may not protrude above the first surface 102a of the housing 102. In an exemplary embodiment, the biasing member 208 may be a spring made from metallic material, such as a spring steel.

In some embodiments, the electronic coupler removal tool 100 may further include a flange 224 configured at the second end 212 of the plunger rod 204. The second end 212 of the plunger rod 204 may remain proximal to the third surface 102c of the housing 102 when the plunger rod 204 is in a compressed state. The flange 224 may be detachably attached to the second end 212 of the plunger rod 204. Operators may use their hand to hold onto the electronic coupler removal tool 100 by the flange 224. The flange 224 may be a rounded portion or may shaped as a handle, such as a spherical-shaped handle. During exertion of force on the flange 224 in the first direction 112, the biasing member 208 may be compressed to cause the plunger rod 204 to protrude above the first surface 102a. The biasing member 208 may be compressed against the stopper element 206 and may retract to an initial state once the exerted force is removed. As the biasing member 208 returns to its initial state, the plunger rod 204 may retract and lie below the first surface 102a of the housing 102. The details of operations for removal of an electronic coupler by using the electronic coupler removal tool 100 is described, for example in FIGS. 3a, 3b, and 3c.

FIGS. 3a, 3b, and 3c, collectively, illustrate an exemplary sequence of operations performed using the electronic coupler removal tool 100 for removal of an electronic coupler 300 from a circuit board port 302. In FIGS. 3a, 3b, and 3c, the electronic coupler 300 is shown as a right-angled electronic coupler that has a specific design. However, the disclosure may not be so limited and in some embodiments, the design of the electronic coupler 300 may be different from the one that has been illustrated in FIGS. 3a, 3b, and 3c, without a deviation from scope of the disclosure.

With reference to FIG. 3a, the electronic coupler 300 may be typically installed within the circuit board port 302 of a circuit board 304. Examples of the electronic coupler 300 may include, but are not limited to, a MOST bus coupler, an RES coupler, or a Fakra connector. The circuit board port 302 may correspond to a communication port for an in-vehicle network and/or a vehicle-to-everything (V2X) communication network. The electronic coupler 300 may be plugged and locked into the circuit board port 302 provided on the circuit board 304 using a locking tab 306 coupled to the electronic coupler 300. Initially when the electronic coupler 300 is plugged into the circuit board port 302, the locking tab 306 may be biased in a locked state. The locking tab 306 may be configured to secure the electronic coupler 300 to the corresponding circuit board port 302 when biased in the locked state.

In the exemplary embodiment, the electronic coupler removal tool 100 is maneuvered such that the electronic coupler 300 is at least partially held within the electronic coupler-receiving portion 108 of the electronic coupler removal tool 100. In the maneuver, the hook member 106 may be positioned to extend at least partially around a cable portion 308 coupled to the electronic coupler 300. Further, the electronic coupler-receiving portion 108 may be positioned at least partially around the electronic coupler 300. During positioning, an open end 310 of the electronic coupler-receiving portion 108 may be aligned coaxially with the electronic coupler 300 and the electronic coupler-receiving portion may slide over the external profile of the electronic coupler 300. The electronic coupler-receiving portion 108 may slide over the external profile of the electronic coupler 300 such that the hook member 106 engages with the cable portion 308. Further, the electronic coupler 300 may be restrained within the electronic coupler-receiving portion 108 and the cable portion 308 may be securely held by the hook member 106. Thereafter, a force may be exerted on the plunger rod 204 to cause the plunger rod 204 to disengage the locking tab 306 of the electronic coupler 300 from the corresponding circuit board port 302. More specifically, the force on the plunger rod 204 may cause the plunger rod 204 to protrude from the first surface 102a and enable the first end 210 of the plunger rod 204 to contact the locking tab 306 and further disengage the locking tab 306 from the circuit board 304. When the locking tab 306 is disengaged, the electronic coupler 300 may be rendered detachable from the circuit board 304. As an example, a pushing action may be performed on the locking tab 306 to cause a movement of the plunger rod 204 in the first direction 112. The pushing action may be applied to release the electronic coupler 300 from the circuit board port 302.

With reference to FIG. 3c, there is shown a maneuver performed using the electronic coupler removal tool 100 to remove the restrained electronic coupler 300 from the circuit board port 302. This may be performed while the locking tab 306 is disengaged (or pressed) based on the force exerted by the plunger rod 204 in contact with the locking tab 306. For the maneuver, in some embodiments, the electronic coupler-receiving portion 108 may be rotated away relative to the electronic coupler 300 to disengage the electronic coupler 300 from the corresponding circuit board port 302. In other embodiments, the electronic coupler removal tool 100 along with the disengaged electronic coupler 300 may be pulled upwards in a third direction 312 away from the corresponding circuit board port 302. The restrained electronic coupler 300 may be pulled in the third direction 312 relative to the circuit board port 302 to remove the electronic coupler 300 from the circuit board port 302. In this case, the electronic coupler-release mechanism 202 and the hook member 106 may act as grip members that may help to lift the cable portion 308 and the restrained electronic coupler 300 from the corresponding circuit board port 302. While pulling the electronic coupler removal tool 100 along the third direction 312, the hook member 106 may engage with the electronic coupler 300 and the cable portion 308. The shape profile of the electronic coupler-receiving portion 108 may allow the cable portion 308 to remain free from any restrain and damage.

Figure 4:
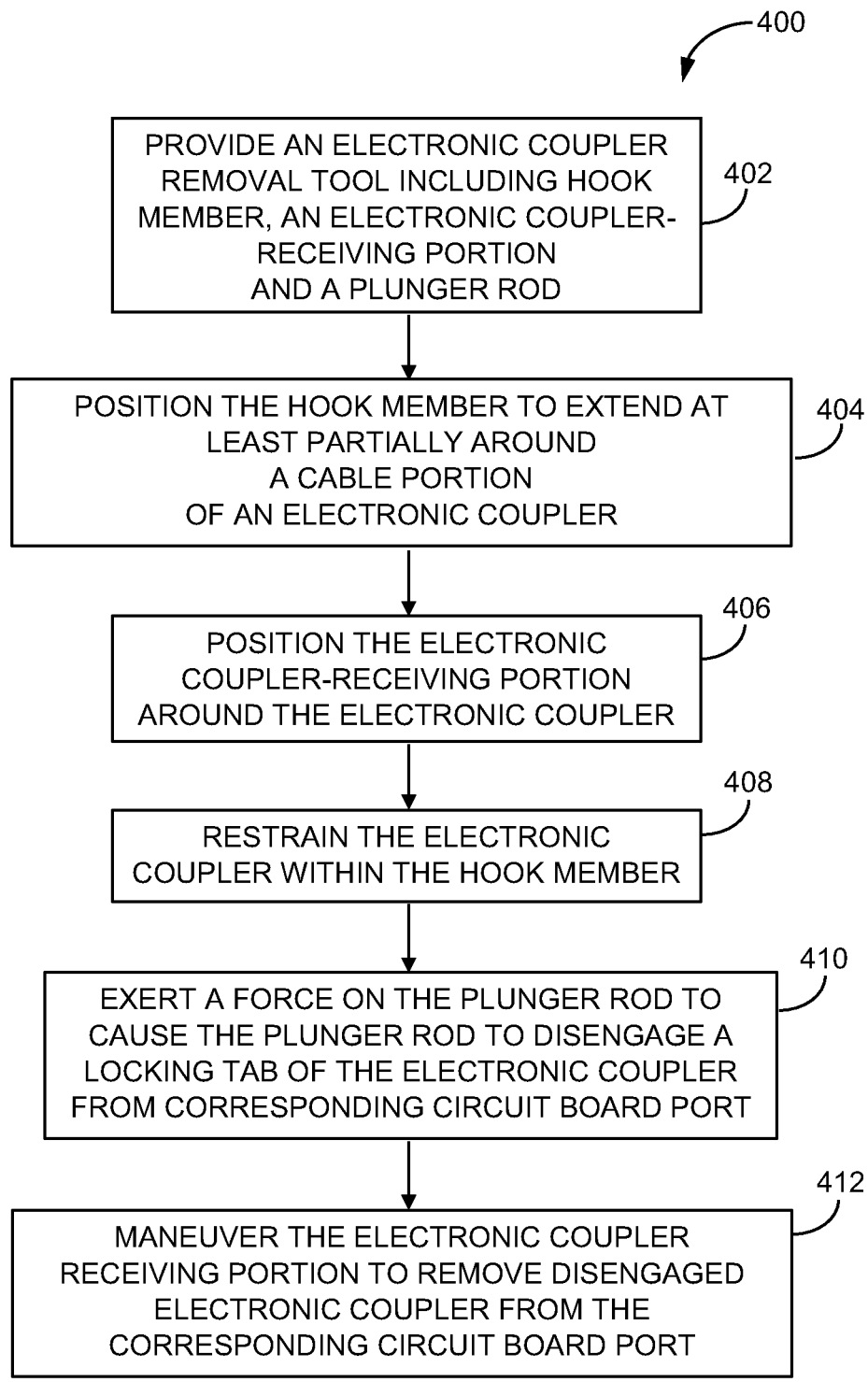
FIG. 4 is a flowchart that illustrates an exemplary method of removing of an electronic coupler from a circuit board using the electronic coupler removal tool of FIG. 1, in accordance with an embodiment of the disclosure.

FIG. 4 is a flowchart that illustrates an exemplary method for removal of an electronic coupler from a circuit board using the electronic coupler removal tool of FIG. 1. FIG. 4 is explained in conjunction with elements from FIGS. 1, 2, 3a, 3b, and 3c. With reference to FIG. 4, there is shown a flowchart 400 that depicts a method for the removal of the electronic coupler 300 from the circuit board port 302. The method performed using the electronic coupler removal tool 100 may start at 402.

At 402, the electronic coupler removal tool 100 for removal of the electronic coupler 300 may be provided. The electronic coupler removal tool 100 may include the hook member 106, the electronic coupler-receiving portion 108, and the plunger rod 204. At 404, the hook member 106 may be positioned to extend partially around the cable portion 308 coupled to the electronic coupler 300. At 406, the electronic coupler-receiving portion 108 may be positioned partially around an external profile of the electronic coupler 300. The electronic coupler-receiving portion 108 may be positioned by aligning the open end 310 of the electronic coupler-receiving portion 108 and sliding the electronic coupler-receiving portion 108 over an external profile of the electronic coupler 300.

At 408, the electronic coupler 300 may be restrained within the hook member 106. More specifically, the hook member 106 may restrain the cable portion 308 coupled to the electronic coupler 300. At 410, a force may be exerted on the plunger rod 204 in the first direction 112 to disengage the locking tab 306 of the electronic coupler 300 from the corresponding circuit board port 302. The force exerted on the plunger rod 204 may be used to maintain a grip over the electronic coupler 300. At 412, the electronic coupler-receiving portion 108 may be maneuvered to remove the disengaged electronic coupler 300 from the circuit board port 302.

For the purposes of the present disclosure, expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural. Further, all joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Reference will now be made in detail to specific aspects or features, examples of which are illustrated in the accompanying drawings. Wherever possible, corresponding or similar reference numbers will be used throughout the drawings to refer to the same or corresponding parts.

The foregoing description of embodiments and examples has been presented for purposes of illustration and description. It is not intended to be exhaustive or limiting to the forms described. Numerous modifications are possible in light of the above teachings. Some of those modifications have been discussed and others will be understood by those skilled in the art. The embodiments were chosen and described for illustration of various embodiments. The scope is, of course, not limited to the examples or embodiments set forth herein, but can be employed in any number of applications and equivalent devices by those of ordinary skill in the art. Rather it is hereby intended the scope be defined by the claims appended hereto. Additionally, the features of various implementing embodiments may be combined to form further embodiments.

What is claimed is:

1. An electronic coupler removal tool comprising:
   a housing comprising a first surface, a second surface, and a third surface;
   a wall extending substantially perpendicularly from a portion of said first surface of said housing;
   a hook member extending substantially perpendicularly from said wall and configured to receive a cable portion coupled to an electronic coupler;
   an electronic coupler-receiving portion defined at least partially by said hook member, said wall, and said first surface of said housing, and configured to slidably receive said electronic coupler; and
   an electronic coupler-release mechanism, said electronic coupler-release mechanism further comprises a plunger rod including a first end and a second end and movable relative to said housing, wherein said plunger rod is configured to engage with a locking tab of said electronic coupler when said electronic coupler is positioned at least partially within said electronic coupler-receiving portion.

2. The electronic coupler removal tool according to claim 1, wherein said housing includes a slot defined therein and said plunger rod includes a stopper element, wherein said slot is configured to limit movement of the stopper element, and therefore movement of the plunger rod.

3. The electronic coupler removal tool according to claim 1, further comprising a biasing member circumferentially disposed about said plunger rod to extend said plunger rod from said first surface of said housing when under compression and retract said plunger rod into said housing when said compression of said biasing member is released.

4. The electronic coupler removal tool according to claim 3, wherein said biasing member is configured to bias said plunger rod into a retracted position within said housing.

5. The electronic coupler removal tool according to claim 3, wherein said biasing member is a spring.

6. The electronic coupler removal tool according to claim 1, further comprising a flange configured at said second end of said plunger rod proximal to said third surface of said housing, wherein an exertion of force on said flange compresses a biasing member to cause said plunger rod to protrude from said first surface.

7. The electronic coupler removal tool according to claim 6, wherein said flange is detachably attached to said second end of said plunger rod.

8. The electronic coupler removal tool according to claim 1, further comprising a base member at least one of coupled to and extending from said third surface of said housing.

9. The electronic coupler removal tool according to claim 1, wherein said electronic coupler-receiving portion is shaped to conform to an external profile of said electronic coupler.

10. The electronic coupler removal tool according to claim 1, wherein said electronic coupler-receiving portion is lifted away relative to said electronic coupler to disengage said electronic coupler from a corresponding circuit board port.

11. The electronic coupler removal tool according to claim 1, wherein said electronic coupler is one of a Media Oriented Systems Transport (MOST) coupler, a Rear Entertainment System (RES) coupler, or a Fakra connector.

12. The electronic coupler removal tool according to claim 1, wherein said locking tab of said electronic coupler is biased in a locked state and configured to secure said electronic coupler to a corresponding circuit board port when in said locked state.

13. The electronic coupler removal tool according to claim 12, wherein said plunger rod is configured to move said locking tab from the locked state into an unlocked state.

14. An electronic coupler removal tool comprising:
a base member;
a housing comprising a first surface, a second surface, and a third surface;
a wall extending substantially perpendicularly from a portion of said first surface of said housing;
a hook member extending substantially perpendicularly from said wall and configured to receive a cable portion coupled to an electronic coupler;
an electronic coupler-receiving portion defined at least partially by said hook member, said wall, and said first surface of said housing, and configured to slidably receive said electronic coupler; and
an electronic coupler-release mechanism, said electronic coupler-release mechanism further comprises:
a plunger rod including a first end and a second end and movable in a first direction, wherein said plunger rod is configured to engage with a locking tab of said electronic coupler when said electronic coupler is positioned at least partially within said electronic coupler-receiving portion;
a biasing member circumferentially disposed about said plunger rod to extend said plunger rod from said first surface of said housing when under compression and retracts said plunger rod into said housing when said compression of said biasing member is released, wherein said biasing member is restrained within said housing by a stopper element; and
a flange configured at said second end of said plunger rod proximal to said third surface of said housing and below said base member, wherein an exertion of force on said flange compresses said biasing member to cause said plunger rod to engage with said locking tab of said electronic coupler when said electronic coupler is positioned at least partially within said electronic coupler-receiving portion.

15. The electronic coupler removal tool according to claim 14, wherein said electronic coupler-receiving portion is shaped to conform to an external profile of said electronic coupler.

16. The electronic coupler removal tool according to claim 14, wherein said flange is detachably attached to said second end of said plunger rod.

17. The electronic coupler removal tool according to claim 14, wherein said electronic coupler-receiving portion is rotated away relative to said electronic coupler to disengage said electronic coupler from a corresponding circuit board port.

* * * * *